(12) United States Patent
Igarashi et al.

(10) Patent No.: US 7,184,739 B2
(45) Date of Patent: Feb. 27, 2007

(54) QUADRATURE MIXER CIRCUITS AND MOBILE TERMINAL USING THE SAME

(75) Inventors: Yutaka Igarashi, Yokohama (JP); Isao Ikuta, Yokohama (JP); Akio Yamamoto, Hiratsuka (JP)

(73) Assignee: Renesas Technology Corp., Tokyo (JP)

( * ) Notice: Subject to any disclaimer, the term of this patent is extended or adjusted under 35 U.S.C. 154(b) by 428 days.

(21) Appl. No.: 10/706,278

(22) Filed: Nov. 13, 2003

(65) Prior Publication Data
US 2004/0147240 A1 Jul. 29, 2004

(30) Foreign Application Priority Data
Nov. 13, 2002 (JP) ............... 2002-329017
Oct. 22, 2003 (JP) ............... 2003-361469

(51) Int. Cl.
  H04B 1/26   (2006.01)
  H04B 1/28   (2006.01)
  H03D 3/00   (2006.01)
  H02M 11/00  (2006.01)
(52) U.S. Cl. .............. 455/313; 455/326; 455/333; 327/102; 327/103
(58) Field of Classification Search ........... 455/313, 455/326, 333; 327/102, 113; 329/315
See application file for complete search history.

(56) References Cited

U.S. PATENT DOCUMENTS

| | | | | |
|---|---|---|---|---|
| 6,029,060 A | * | 2/2000 | Ashby ................ | 455/326 |
| 6,084,466 A | * | 7/2000 | Phanse et al. ........ | 327/560 |
| 6,121,818 A | * | 9/2000 | Kim et al. ........... | 327/359 |
| 6,433,647 B1 | * | 8/2002 | Filoramo et al. ..... | 332/103 |
| 6,933,766 B2 | * | 8/2005 | Khlat et al. ........ | 327/359 |
| 6,999,745 B2 | * | 2/2006 | Leenaerts ........... | 455/313 |

OTHER PUBLICATIONS

A. Karimi-Sanjaari et al., "A GHz Merged CMOS LNA and Mixer for WCDMA", 2001 Symposium on VLSI Circuits Digest of Technical Papers, Jun. 2001, pp. 19-22, Tokyo, Japan.

* cited by examiner

*Primary Examiner*—Duc M. Nguyen
(74) *Attorney, Agent, or Firm*—McDermott Will & Emery LLP

(57) ABSTRACT

Because there are different voltages at two current output terminals of a current divider, the voltages at the current input terminals of two current switch circuits are not affected mutually even with a large amplitude of local signals. Accordingly, the performance of a quadrature mixer can be enhanced by increasing the amplitude of the local signals. Bias currents are supplied to the two current switch circuits through the current divider from a common DC current source which essentially supplies a bias current to a V/I converter and, therefore, power consumption is reduced.

9 Claims, 13 Drawing Sheets (a)

(b)

QUADRATURE MIXER CIRCUITS AND MOBILE TERMINAL USING THE SAME

BACKGROUND OF THE INVENTION

1. Field of the Invention

The present invention relates to a mixer circuit and a mobile terminal using same and, more particularly, to a quadrature mixer which performs signal frequency conversion, using two local equal-frequency signals with a 90 degree phase difference, and a mobile terminal using such a mixer.

2. Description of the Prior Art

Grounded on semiconductor circuit technology improvements, taking advantage of a merit of semiconductor circuits (although there is dispersion of absolute values of constants of parts among semiconductor chips, relative values of constants of parts within one semiconductor chip are matching with a high accuracy), wireless signal processing circuit topologies which dispense with a SAW filter and a dielectric filter have been proposed. Such topologies include a zero-IF receiver, near zero IF receiver, and wide band IF receiver. Any of these receivers does not need an external SAW filter and dielectric filter and suppresses unwanted signals falling out of a desired bandwidth with filters that can be built on a semiconductor device (some wireless communication method or system requirements may specify that the above-mentioned receivers should have some external filter).

The zero-IF receiver, near zero IF receiver, and wide band IF receiver feature a common characteristic configuration of a mixer circuit which performs signal frequency conversion. This mixer is called a quadrature mixer and its example is provided in FIG. 1 "Merged LNA and Mixer for 2.14 GHz direct conversion front-end" in a document (A. Karimi-Sanjaani, H. Sjoland and A. Abidi, "A 2 GHz Merged CMOS LNA and Mixer for "WCDMA", In Digest of Tech. Papers VLSI Symposium 2001, June 2001, pp. 19–22, Tokyo, Japan).

SUMMARY OF THE INVENTION

Problems associated with prior-art quadrature mixers are solved by the invention as delineated by the appended claims. By configuring a quadrature mixer as described in the claims, it can be designed to prevent the positive crests of waveforms of input signals from being clipped, avoid degradation of characteristics, and reduce current consumption.

An example of typical means of the present invention is given as follows. A quadrature mixer circuit of the present invention comprises an input terminal, a voltage-current converter which converts the voltage of a signal from the input terminal into signal current, a DC current source which supplies a bias current to the voltage-current converter, a current divider which outputs a first output current and a second output current which are two substantially equal halves into which output current of the voltage-current converter is divided, a local signal oscillator, a 90° phase shifter which outputs a local signal whose phase is substantially 90 degrees ahead or behind the phase of a local signal from the local signal oscillator, a first current switch circuit which switches on/off the first output current from the current divider at timing of the local signal from the local signal oscillator, a first-current-voltage converter which converts signal current output from the first current switch circuit into a voltage signal, a second current switch circuit which switches on/off the second output current from the current divider at timing of the local signal output from the 90° phase shifter, and a second current-voltage converter which converts signal current output from the second current switch circuit into a voltage signal. The quadrature mixer is characterized in that the current divider is arranged to output the first output current and the second output current, making the amplitude of output voltage of the first output current different from the amplitude of output voltage of the second output current.

To extract the problems, the present inventors analyzed the technology described in the above-mentioned document, FIG. 1, and represented it in a block diagram which is shown in FIG. 6. Current switch circuits 18 and 19 in a quadrature mixer shown in FIG. 6 are realized with transistor circuits in a semiconductor circuitry arrangement. Voltage at current input terminals 25 and 26 of the current switch circuits 18 and 19 is affected by the voltage of signals input to local input terminals 27 and 28. When sinusoidal signals are input through the local input terminals 27 and 28, the waveforms of the signals input to the local input terminals 27 and 28 are shown in FIG. 7. In FIG. 6, reference numerals 33 and 34 denote unbalanced-balanced converters and 35 and 36 denote balanced-unbalanced converters.

In FIG. 6, for both a pair of transistors 29 and 30 and a pair of transistors 31 and 32, the transistors' emitters are short-circuited. Thus, in the waveforms 101 and 102 of the input signals to the local input terminals 27 and 28 of the quadrature mixer, shown in FIG. 7, as amplitude increases, the positive crests of the waveforms (high-voltage portions) are clipped. In general, the amplitude of the input signals to the local input terminals 27 and 28 of the quadrature mixer must be large to enhance gain and noise characteristics, which results in distorted waveforms of the local signals in the quadrature mixer as shown in FIG. 6, like waveforms 103 and 104 with clipped positive crests which are shown in FIG. 8. Consequently, unnecessary higher harmonics of the local signals increase and, eventually, a part of the local signal input to the local input terminal 27 intrudes into the current switch circuit 19; on the other hand, a part of the local signal input to the local input terminal 28 intrudes into the current switch circuit 18. Due to equal on and off time durations of the current switch circuits 18 and 19 with the input of the local signal waveform having asymmetric positive and negative portions, as shown in FIG. 8, problems such as degradation of second order distortion characteristics and DC offset occur in the quadrature mixer. Therefore, subject matters of the present invention are as follows. The invention provides a quadrature mixer circuit in which the waveforms of the input signals remain perfect without clipped positive crests when pulsating with great amplitude, degradation of characteristics does not occur, and current consumption is reduced. Moreover, the invention provides a light-weight mobile terminal which can keep in its idle state longer without degradation in performance.

According to the present invention, quadrature mixer circuits, semiconductor integrated circuit arrangements for wireless (RF) communication, and mobile terminals with reduced power consumption can be provided.

The above advantages and other advantages, objects, and features of the present invention will be more apparent from the following detailed description of the preferred embodiments when taken in conjunction with the accompanying drawings and the attached claims.

DETAILED DESCRIPTION OF THE PREFERRED EMBODIMENTS

Figure 1:
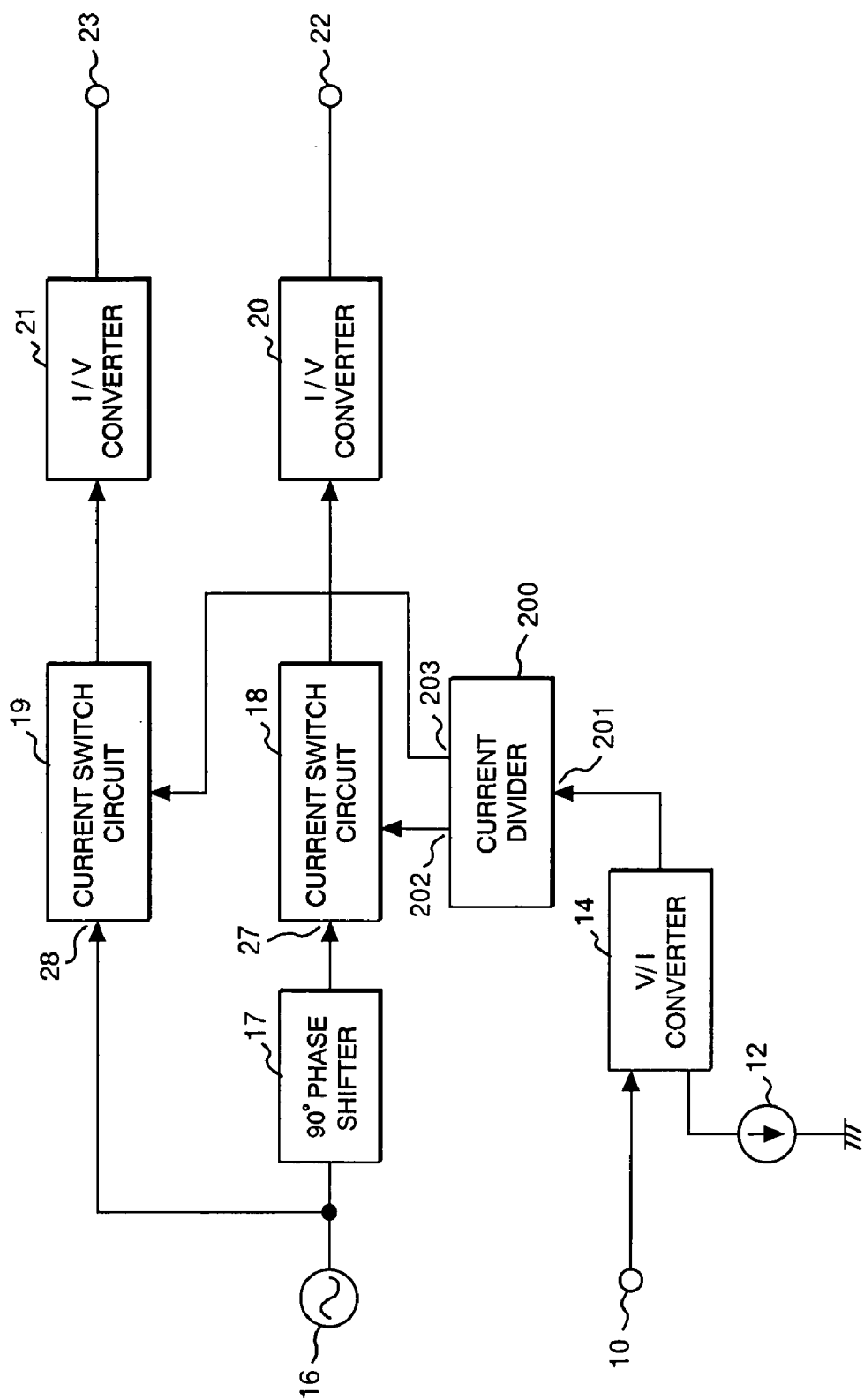
FIG. 1 is a block diagram of a quadrature mixer for explaining a preferred Embodiment 1 of the invention.
Figure 6:
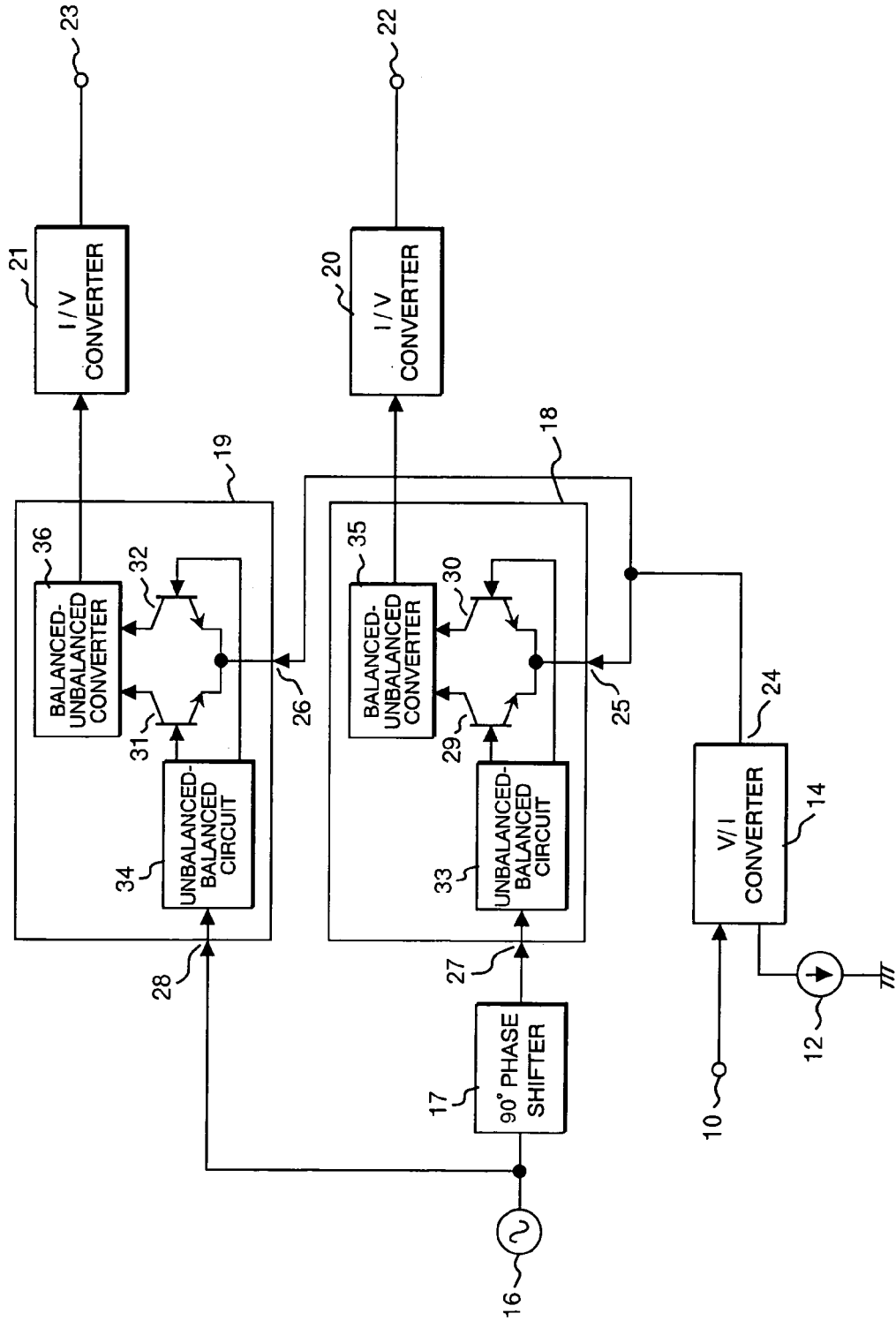
FIG. 6 is a block diagram of a quadrature mixer in which current consumption is reduced for explaining a prior-art example.

Preferred embodiments of the present invention will be described hereinafter with reference to the accompanying drawings. Refer to FIG. 1 wherein constituent elements corresponding to those shown in FIG. 6 are identified by the same reference numbers. FIG. 1 is a block diagram of a quadrature mixer according to a preferred Embodiment 1 of the present invention. There are one DC current source 12 and one voltage-current converter (I/V converter) 14. Output current from the V/I converter 14 is divided by a current divider 200. The quadrature mixer of FIG. 1 will be explained in detail hereinafter.

A signal from a local signal oscillator 16, which is in phase with the local signal oscillator 16, is input to a current switch circuit 19. Besides, a signal from the local signal oscillator 16 is 90 degree phase shifted by a 90° phase shifter 17 and then input to s current switch circuit 18.

The current switch circuits 18 and 19 switches on/off output currents from the current divider 200 at the timings of the local signals which have respectively been input to them. That is, the timing when the current switch circuit 18 switches on/off one output current from the current divider 200 differs from the timing when the current switch circuit 19 switches on/off the other output current from the current divider 200 and this difference corresponds to 90 degree phase difference between the two local signals. The output currents from the current switch circuits 18 and 19 include a frequency component of difference between or the sum of the signal frequency of the output current from the current divider 200 and the signal frequency of the local signal oscillator 16. The above 90 degree phase difference broadly means that the phases of the two local signals differ by substantially 90 degrees, provided the present invention is effected.

The output currents from the current switch circuits 18 and 19 are converted into voltages by current-voltage converters (I/V converters) 20 and 21, respectively, and the voltages are output from output terminals 22 and 23, respectively.

A signal input through an input terminal 10 is input to the V/I converter 14. Because the V/I converter 14 is configured as a transistor circuit, this converter requires a bias current. Therefore, DC current from the DC current source 12 is input as the bias current to the V/I converter 14. An output signal from the V/I converter 14 is input to the current divider 200. As for the current divider 200, if current input to a current input terminal 201 of the current divider is represented by I_201, voltage at and current output from a current output terminal 202 of the current divider 200 are represented by V_202 and I_202, respectively, and voltage at and current output from a current output terminal 203 of the current divider 200 are represented by V_203 and I_203, respectively, there shall be relations as represented by the following mathematical expressions:

$$I\_202 = I\_203 \quad \text{(Expression 1)}$$

$$|I\_201| \geq |I\_202 + I\_203| \quad \text{(Expression 2)}$$

$$V\_202 \neq V\_203 \quad \text{(Expression 3)}$$

According to the relations of (Expression 1) and (Expression 2), the output currents from the current divider 200 are supplied as bias currents to the current switch circuits 18 and 19, so that current consumption is reduced. Here, (Expression 1) is a necessary condition that must be fulfilled to make the conversion gain of a signal from the input terminal 10 to the output terminal 22 equal to the conversion gain of a signal from the input terminal 10 to the output terminal 23. The inequality sign of (Expression 2) indicates that it is not necessary to supply all the bias current from the V/I converter 14 to the current switch circuits 18 and 19 through the current divider 200 configuration.

Figure 8:
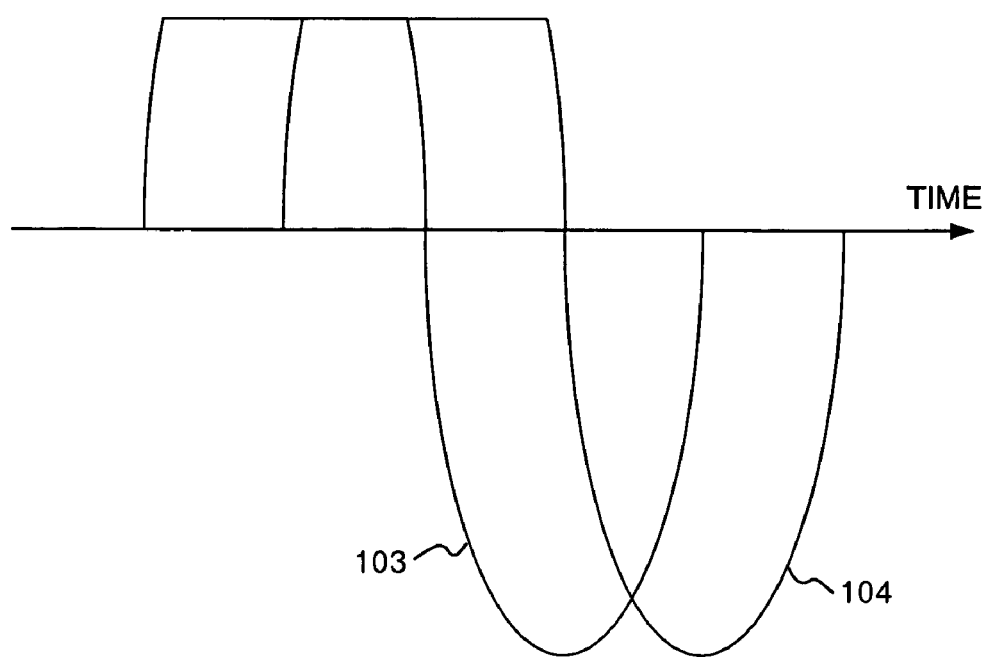
FIG. 8 is a diagram showing waveforms (with large amplitude) of the local signals input to the local input terminals of the quadrature mixer of FIG. 6.

According to the relation of (Expression 3), it does not happen that the positive crest of the local signal waveform is clipped as shown in FIG. 8. Thus, it can be prevented that unnecessary higher harmonics of the local signals increase and, eventually, a part of the local signal input to the local input terminal 27 intrudes into the current switch circuit 19; on the other hand, a part of the local signal input to the local input terminal 28 intrudes into the current switch circuit 18. Also, such problems can be prevented as degradation of second order distortion characteristics and DC offset in the quadrature mixer, due to equal on and off time durations of the current switch circuits 18 and 19 with the input of the local signal waveform having asymmetric positive and negative portions, as shown in FIG. 8.

Figure 2:
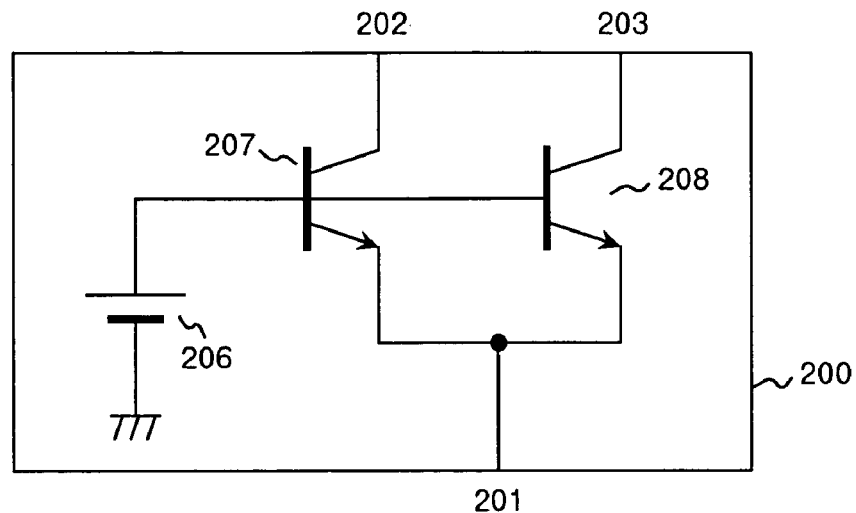
FIG. 2 is a diagram showing one example of circuit schematic of a current divider.

A circuit example of the current divider 200 is shown in FIG. 2. In FIG. 2, elements that operate in the same manner as corresponding ones in the current divider 200 shown in FIG. 1 are assigned the same reference numbers as used for the elements in FIG. 1 and their explanation is not repeated. In FIG. 2, reference numerals 207 and 208 denote transistors and 206 denotes a DC voltage source. The transistors 207 and 208 are of equal size and, therefore, have equal resistance values. In FIG. 2, (Expression 1) (Expression 2), and (Expression 3) are fulfilled. Because base currents exist in the current divider of FIG. 2, |I_201| is greater than |I_202+I_203|, and this circuit is an example of the current divider configuration according to the foregoing description that "the inequality sign of (Expression 2) indicates that it is not necessary to supply all the bias current from the V/I converter 14 to the current switch circuits 18 and 19 through the current divider 200 configuration."

Figure 7:
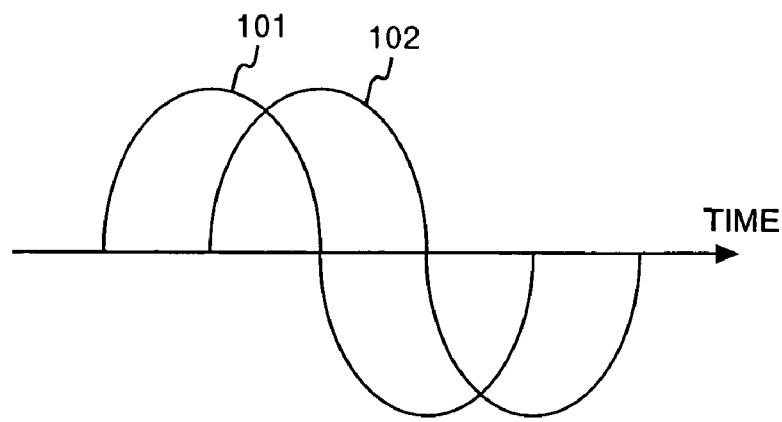
FIG. 7 is a diagram showing waveforms (with small amplitude) of local signals input to local input terminals of the quadrature mixer of FIG. 6.

By employing the current divider 200 configured as in FIG. 2, when sinusoidal signals are input through the local input terminals 27 and 28 of the quadrature mixer of FIG. 1, the waveforms of the signals as shown in FIG. 7 will be observed. Because the impedance of the V/I converter 14 is sufficiently high, when viewed from the current switch circuits 18 and 19, intrusion of a part of the local signals from the current switch circuits 18 and 19 into the V/I converter 14 is suppressed.

Figure 3:
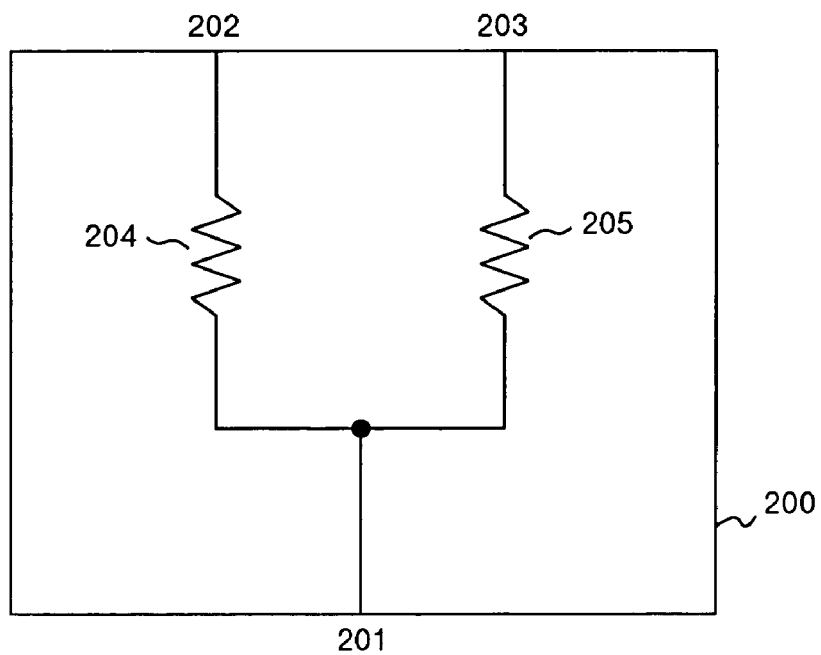
FIG. 3 is a diagram showing another example of circuit schematic of the current divider.

Another circuit example of the current divider 200 is shown in FIG. 3. In FIG. 3, elements that operate in the same manner as corresponding ones in the current divider 200 shown in FIG. 1 are assigned the same reference numbers as used for the elements in FIG. 1 and their explanation is not repeated. In FIG. 3, reference numerals 204 and 205 denote resistors. The resistors 204 and 205 have equal resistance values. In FIG. 3 also, (Expression 1), (Expression 2), and (Expression 3) are fulfilled.

The current divider of FIG. 3 has the same effect as that of FIG. 2 and is a more suitable configuration than that of FIG. 2 for a low-voltage circuit to be used in a battery-powered mobile terminal or the like, because this circuitry does not employ transistors. However, the impedance of the V/I converter 14 viewed from the current switch circuits 18 and 19 is lower than the corresponding impedance in the circuit of FIG. 2. Therefore, the characteristic of suppressing the intrusion of a part of the local signals from the current switch circuits 18 and 19 into the V/I converter 14 is slightly degraded as compared with the circuit of FIG. 2.

There are possible topologies of the current divider 200 besides those examples shown in FIGS. 2 and 3 and this circuit may be configured in one of such topologies, provided (Expression 1), (Expression 2), and (Expression 3) are fulfilled substantially.

The output currents from the current divider 200 are input to the current switch circuits 18 and 19, respectively. Because the current switch circuits 18 and 19 also are transistor circuits, these circuits require bias currents, but are supplied with the output currents from the current divider 200 as the bias currents and, accordingly, current consumption is reduced.

Figure 4:
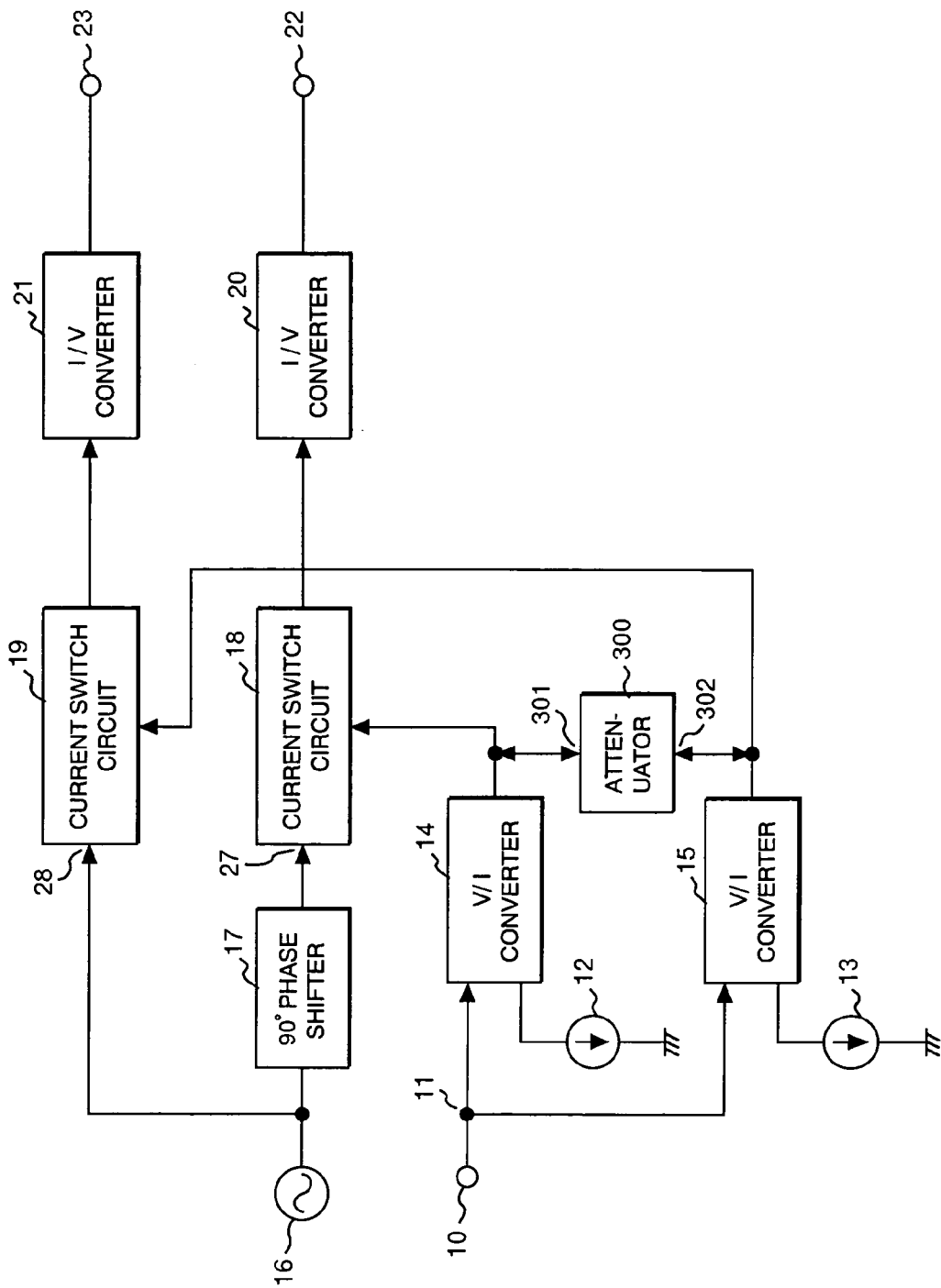
FIG. 4 is a block diagram of a quadrature mixer for explaining a preferred Embodiment 2 of the invention.

FIG. 4 is a block diagram of a quadrature mixer according to a preferred Embodiment 2 of the present invention. In FIG. 4, elements that operate in the same manner as corresponding ones shown in FIG. 1 are assigned the same reference numbers as used for the elements in FIG. 1 and their explanation is not repeated.

In the quadrature mixer of FIG. 4, for both the pair of transistors 29 and 30 and the pair of transistors 31 and 32, the transistors' emitters are not short-circuited. Thus, it does not happen that the positive crest of the local signal waveform is clipped as shown in FIG. 8. Unless there is an attenuator 300, because there are two V/I converters 14 and 15, power consumption increases to obtain the same gain as the quadrature mixer of FIG. 1. Therefore, the attenuator 300 is employed to attenuate the signal current or voltage, so that power consumption is reduced.

Specifically, the attenuator operates as follows. The attenuator 300 attenuates the current or voltage of a signal routed from a terminal 301 to a terminal 302. The attenuator also attenuates a signal routed from the terminal 302 to the terminal 301 in a reverse direction by the same quantity of attenuation as for the signal from the terminal 301 to the terminal 302. Signal components of the output currents from the V/I converters 14 and 15 with their gains reduced by the attenuator 300 for low-current operation are added. As a result, the gain of the quadrature mixer of FIG. 4 increases.

As for the attenuator 300, if voltages at the terminals 301 and 302 of the attenuator are represented by V_301 and V_302, respectively, there shall be a relation represented by the following mathematical expression:

$$V\_301 \neq V\_302 \quad \text{(Expression 4)}$$

Figure 5:
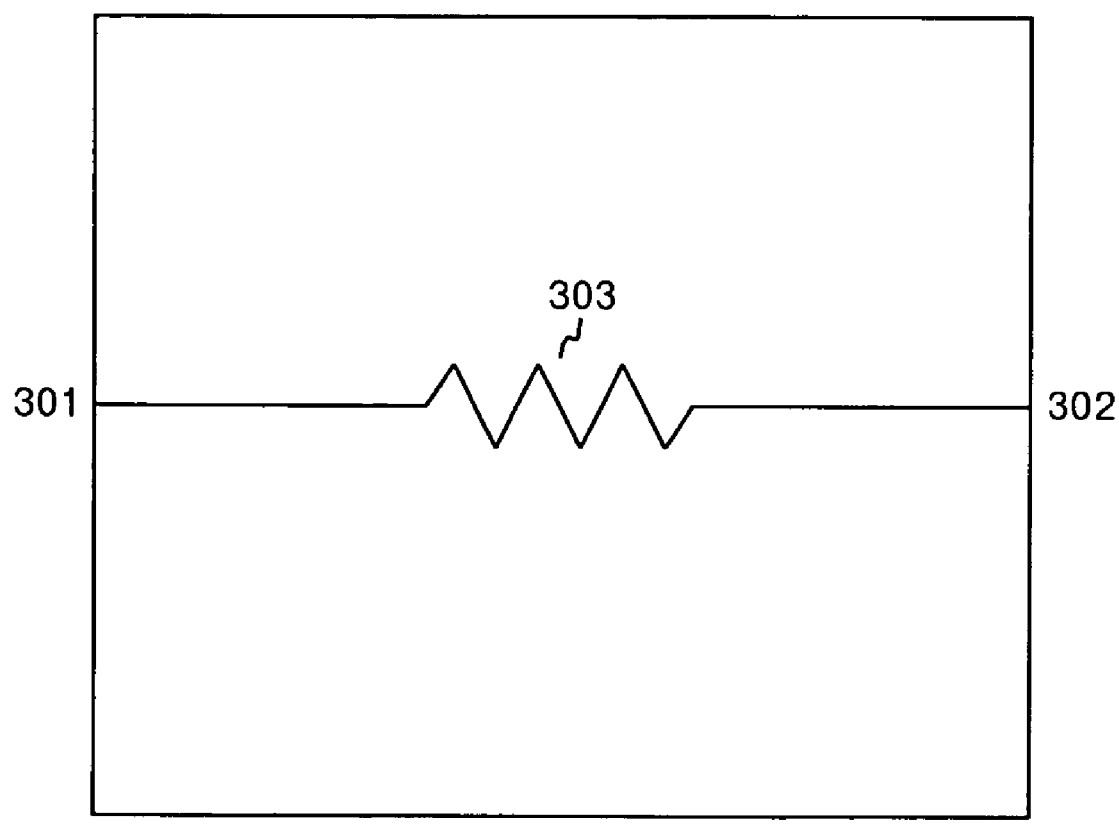
FIG. 5 is a diagram showing one example of circuit schematic of an attenuator.

A circuit example of the attenuator 300 is shown in FIG. 5. In FIG. 5, elements that operate in the same manner as corresponding ones in the attenuator 300 shown in FIG. 4 are assigned the same reference numbers as used for the elements in FIG. 4 and their explanation is not repeated. In FIG. 5, reference numeral 303 denotes a resistor. Using only one resistor, as shown in FIG. 5, it is possible to effect the function required of the attenuator in FIG. 4. The circuit of FIG. 5 fulfills (Expression 4). There are possible topologies of the attenuator 300 besides its example shown in FIG. 5 and this circuit may be configured in one of such topologies, provided (Expression 4) is fulfilled substantially.

By applying one of the quadrature mixer circuit arrangements described in the foregoing embodiments to a mobile terminal, the mobile terminal can be provided that features the following: gain characteristics and noise characteristics can be enhanced, signal distortion can be reduced, in other word, degradation of characteristics can be prevented, and reduction in power consumption can be achieved. Because reduction in power consumption can be achieved, the mobile terminal can keep in its idle state longer and its weight can be reduced accordingly.

Figure 9:
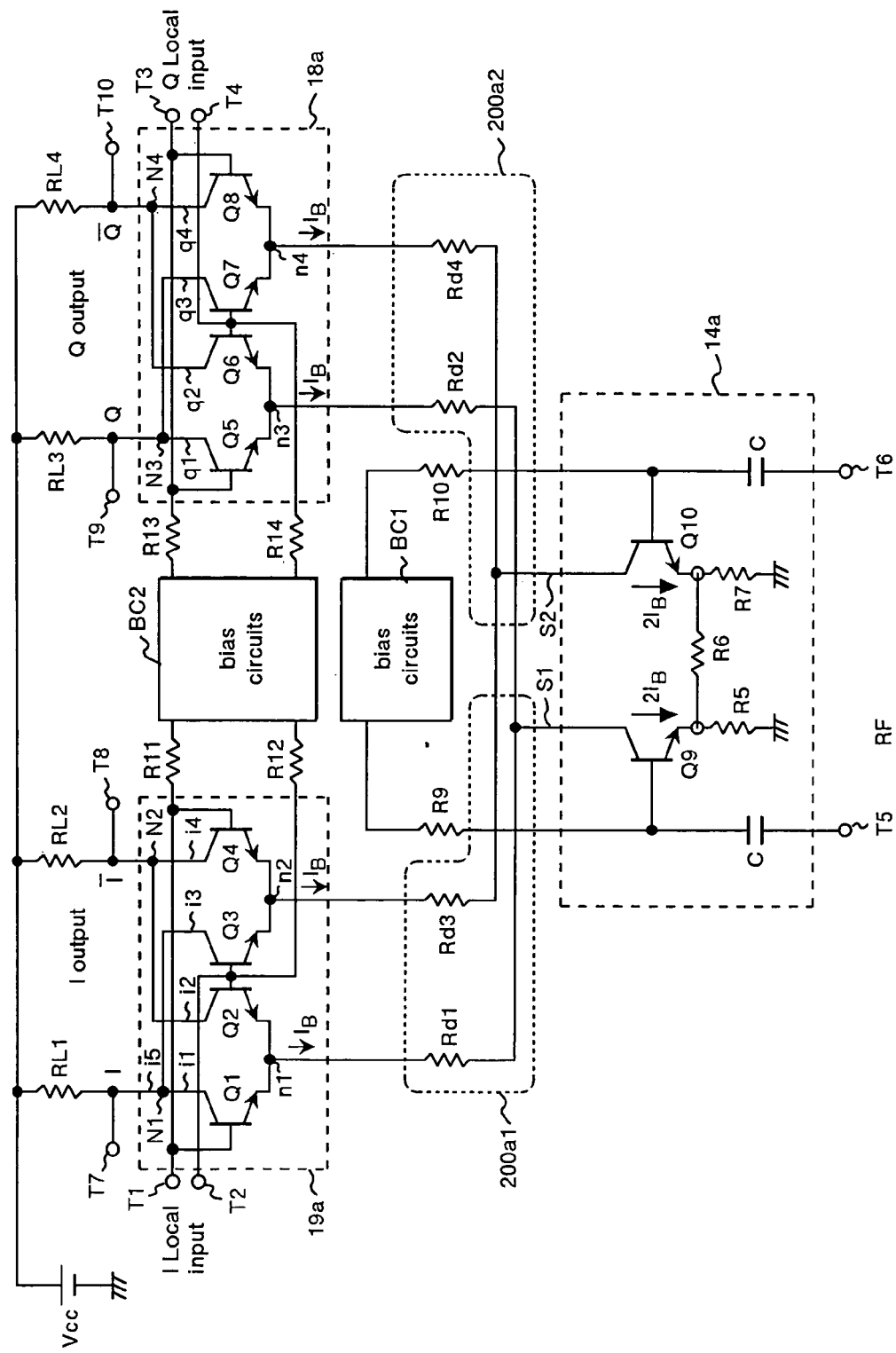
FIG. 9 is a diagram showing a quadrature mixer according to a preferred Embodiment 3 of the present invention.

FIG. 9 is a diagram showing a quadrature mixer according to a preferred Embodiment 3 of the present invention, which is a circuit schematic of a concrete configuration example of the quadrature mixer including the current divider, shown in FIG. 1. In Embodiment 3, only the main part of the quadrature mixer is shown with the omission of the oscillator which generates local signals and the 90° phase shifter. In FIG. 9, a V/I converter 14a is made up of two bypass capacitors C which cut off DC, three resistors R5, R6, and R7, and transistors Q9 and Q10 which constitute a first differential pair and receives an RF received signal voltage through terminals T5 and T6 and converts this voltage into signal currents s1 and s2 with a 180 degree phase difference.

A current switch circuit 19a is made up of transistors Q1 and Q2 which constitute a second differential pair and transistors Q3 and Q4 which constitute a third differential pair. The second differential pair receives a local signal from the local oscillator through terminals T1 and T2, switches on/off current input to a current input node n1 at timing of this local signal, and converts the current into I output signal currents i1 and i2 with a 180 degree phase difference. Similarly, the third differential pair receives a local signal from the local oscillator through the terminals T1 and T2, switches on/off current input to a current input node n2 at timing of this local signal, and converts the current into output signal currents i3 and i4 with a 180 degree phase difference.

A current switch circuit 18a is made up of transistors Q5 and Q6 which constitute a fourth differential pair and transistors Q7 and Q8 which constitute a fifth differential pair. The fourth differential pair receives a local signal routed through the 90° phase shifter through terminals T3 and T4, switches on/off current input to a current input node n3 at timing of this local signal, and converts the current into output signal currents q1 and q2 with a 180 degree phase difference. Similarly, the fifth differential pair receives a local signal routed through the 90° phase shifter through the terminals T3 and T4, switches on/off current input to a current input node n4 at timing of this local signal, and converts the current into output signal currents q3 and q4 with a 180 degree phase difference. The output signal s1 from the first differential pair is routed through a resistor Rd1 to the current input node n1 and routed through a resistor Rd2 to the current input node n3. The output signal s2 from the first differential pair is routed through a resistor Rd3 to the current input node n2 and routed through a resistor Rd4 to the current input node n4. The resistors Rd1 to Rd4 have a same resistance value, for example, 50 Ω.

From a terminal T7 connected to a connection point between a connection node N1 at which the output signal currents i1 and i3 are added and coupled and a load resistor RL1, an I output voltage signal is obtained as a mixer output, a product of multiplying the RF input signal by the local signal. From a terminal T8 connected to a connection point between a connection node N2 at which the output signal currents i2 and i4 are added and coupled and a load resistor RL2, an I⁻ output voltage signal is obtained as a mixer output. Here, a bar symbol "⁻" denotes inversion. This kind of mixer circuit is also called a Gilbert cell type quadrature mixer circuit.

From a terminal T9 connected to a connection point between a connection node N3 at which the output signal currents q1 and q3 are added and coupled and a load resistor RL3, a Q output voltage signal is obtained as a mixer output, a product of multiplying the RF signal by the local signal. From a terminal T10 connected to a connection point between a connection node N4 at which the output signal currents q2 and q4 are added and coupled and a load resistor RL4, a Q⁻output voltage signal is obtained as a mixer output, a product of multiplying the RF input signal by the local signal. The load resistors RL1 to RL4 have a same resistance value.

A bias circuit BC1 is a circuit for supplying a bias current to the bases of the differential pair of transistors Q9 and Q10 through resistors R9 and R10. A bias circuit BC2 is a circuit for supplying a bias current to the bases of the transistors Q1 and Q4 through a resistor R11, the base of the transistors Q2 and Q3 through a resistor R12, the transistors Q5 and Q8 through a resistor R13, and the base of the transistors Q6 and Q7 through a resistor R14, respectively. Vcc is a supply voltage of the circuit. If current at which each of the second to fifth differential pairs operates is IB, current at which each of the transistors of the first pair operates is 2IB.

The mixer circuit of Embodiment 3, which is configured as described above, is formed as an integrated circuit arrangement on a semiconductor substrate. As is the case for Embodiment 1, the bias currents to the current switch circuits 18a and 9a and the bias current to the V/I converter 14a are supplied from a common source through current dividers 200a1 and 200a2 and, therefore, current consumption is diminished.

While the RF received signal voltage has been mentioned as an input signal to the quadrature mixer in Embodiment 3, an IF (intermediate frequency) received signal converted from the RF received signal voltage may be input to the mixer.

Figure 11:
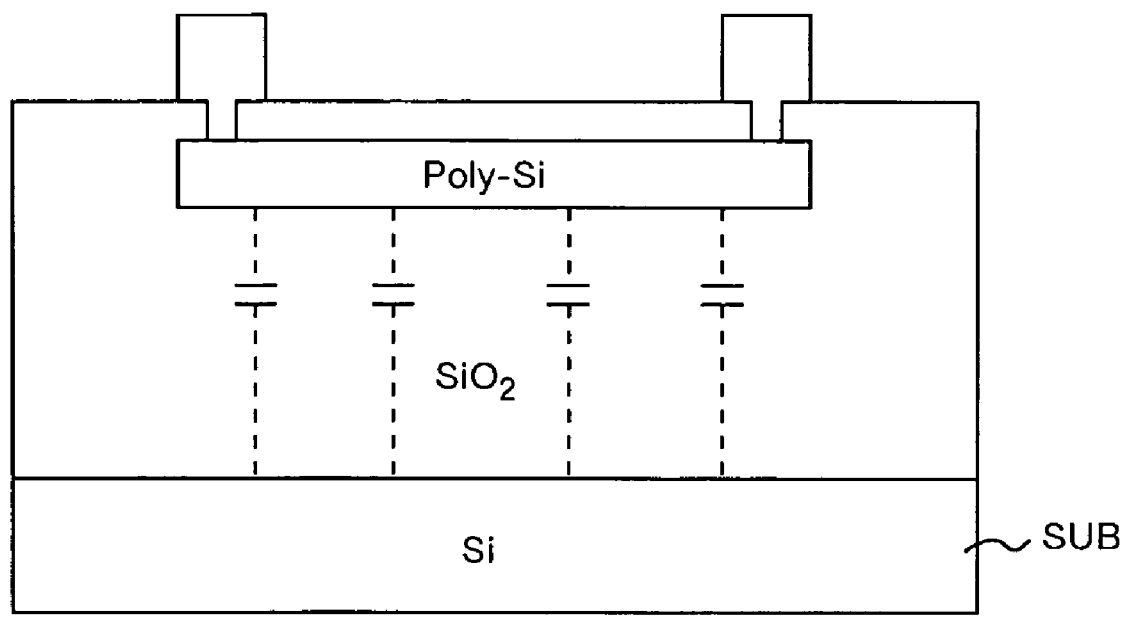
FIG. 11 is a cross-sectional view of a polycrystalline silicon resistor which is used in the quadrature mixer according to the present invention.
Figure 12:
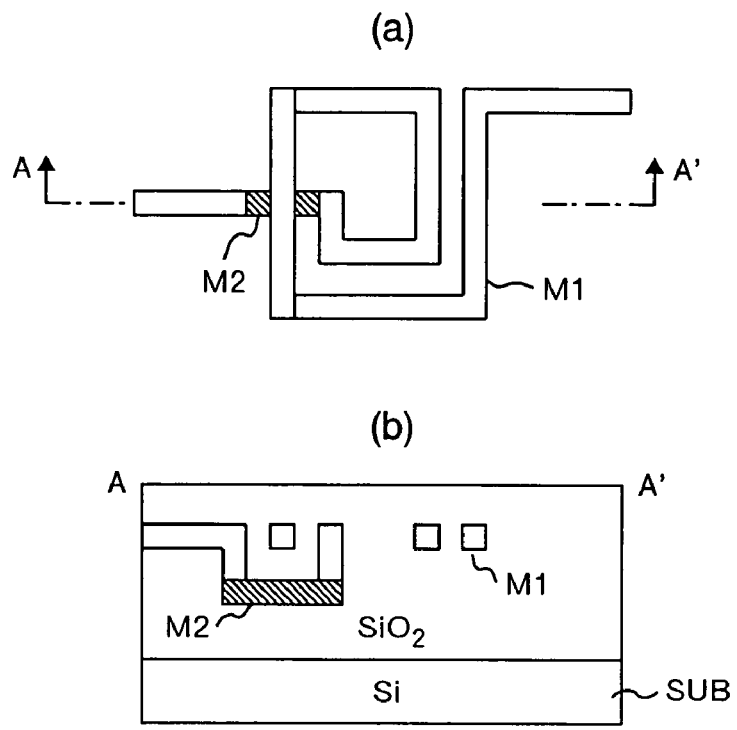
FIG. 12(a) is a plan view of a spiral resistor which is used in the quadrature mixer according to the present invention.
FIG. 12(b) is a cross-sectional view of the spiral resistor.
Figure 13:
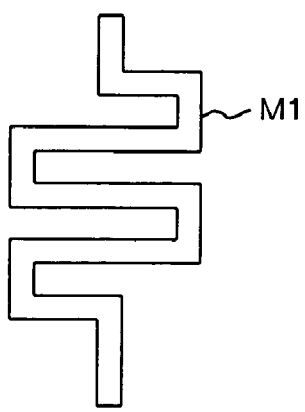
FIG. 13 is a plan view of a resistor using meandering-shape metal wiring, which is used in the quadrature mixer according to the present invention.

As the resistors Rd1 to Rd4 across which differential complementary signals s1 and s2 which are two output signals from the first differential pair in the lower stage of the quadrature mixer circuit of Embodiment 3 are applied to the current input nodes n1 to n4 of the four second to fifth differential pairs in the upper stage, resistors using polycrystalline silicon (Poly-Si) whose structure is shown in FIG. 11 or resistors using wiring layers of metal such as aluminum, pattern formed into a spiral shape or meandering shape, which are shown in FIGS. 12 and 13, may be employed. For example, a polycrystalline silicon resistor is formed in a position above off from the Si substrate SUB with the intervention of an insulating silicon oxide layer (SiO2), as shown in its cross-sectional view of FIG. 11, and, therefore, its parasitic capacitance is small. Accordingly, leak signal components, that is, RF signal leaks from the local oscillator across the parasitic capacitance can be reduced. In the case of spiral resistors using the metal wiring, as upper a wiring layer M1 as possible should be used. As shown in FIG. 12(b), a cross-sectional view of a section cut along a A–A' line in FIG. 12(a), a lower wiring layer M2 should be used to form a crossing section of the spiral or a diffusion layer in a transistor formation of the V/I converter 14a may be used.

Figure 14:
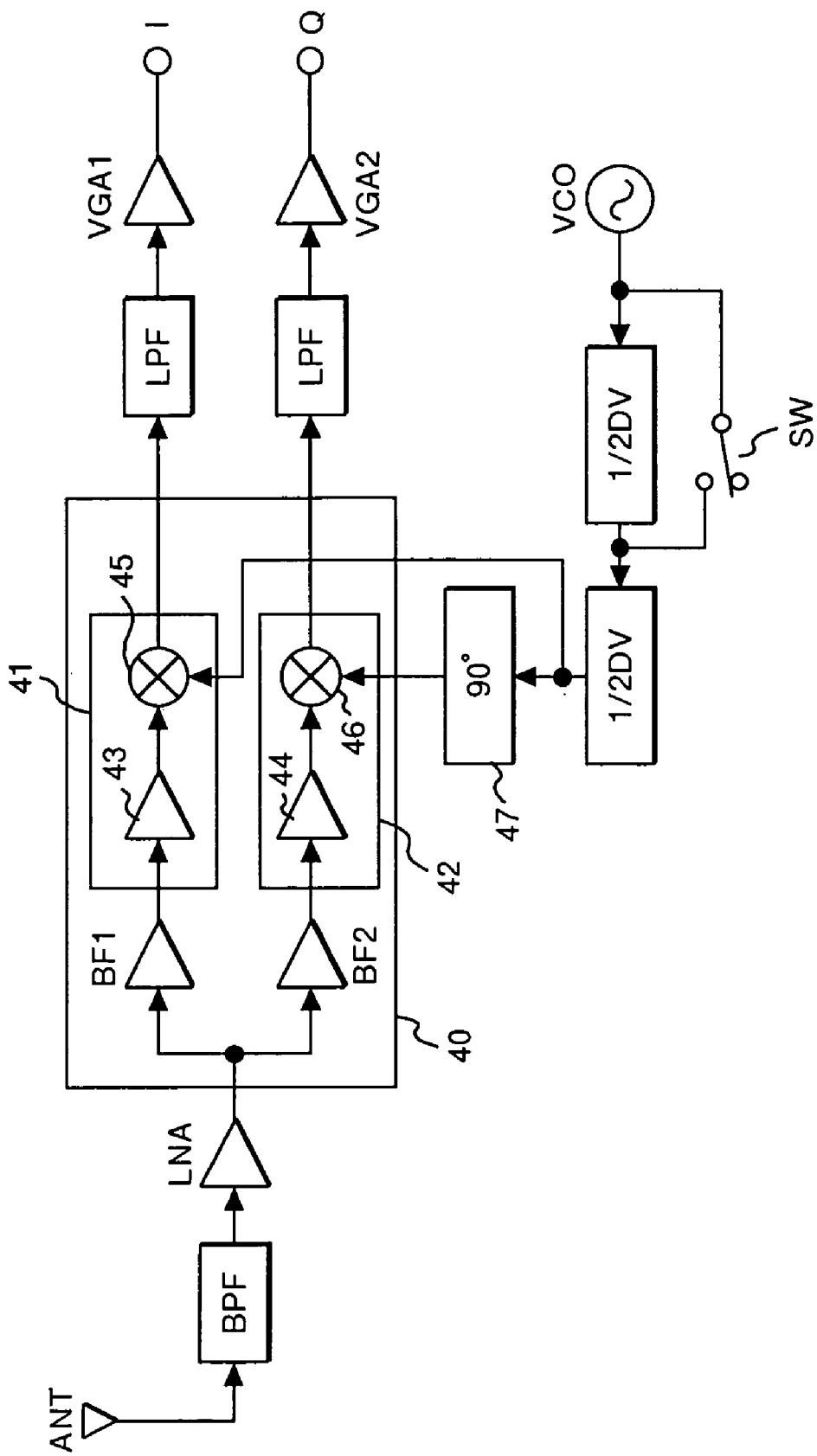
FIG. 14 is a main structural diagram of a direct conversion receiver to which the quadrature mixer of the present invention should apply appropriately.

By way of example, application of the quadrature mixer of Embodiment 3 to a direct conversion receiver (also called a zero-IF receiver) configured as is shown in FIG. 14 will be discussed below. In FIG. 14, arrows from one block to another are used to denote differential signals to simplify explanation. An RF signal received by an antenna ANT is input through a band-pass filter BPF to a low noise amplifier LNA and an output signal from the low noise amplifier is input to a quadrature mixer 40 where the output signal is divided. To compensate decrease in the voltage of divided output signals from the low noise amplifier LNA, the output signals are respectively routed through buffers BF1 and BF2 of emitter follower structure and input to mixer cores 41 and 42. The mixer cores 41 and 42 are circuits which are respectively formed of V/I converters 43 and 44 and current switch and load circuits 45 and 46. To the current switch and load circuit 45, a local signal with a predetermined frequency which is obtained by making an output of a voltage control oscillator (VCO) pass through one or two ½ frequency dividers (½ DV) is input. To the current switch and load circuit 46, a local signal with the above predetermined frequency, 90 degree phase shifted by a 90° phase shifter 47, is input. In the mixer core 41, the RF signal is multiplied by the local signal, and its output passes through a low-pass filter LPF where unwanted signals falling out of a desired channel bandwidth are attenuated. After the LPF output is amplified by a variable gain amplifier VGA1, a complementary I output signal (I, I⁻) is obtained. While a single stage of the variable gain amplifier is shown in FIG. 14, actually, multiple stages of the VGAs may be connected so that the LPF output is amplified up to a required signal level.

In the mixer core 42, on the other hand, the RF signal is multiplied by the 90 degree phase shifted local signal, and its output passes through the low-pass filter LPF to the variable gain amplifier VGA2, and, eventually, a complementary Q output signal (Q, Q⁻) is obtained. The above-mentioned predetermined frequency is a signal frequency specified for a receiving system. For example, for a GSM1800 compliant direct conversion receiving system, a receiving frequency bandwidth of 1.805 to 1.880 GHz is used. In this system, a local signal with a frequency falling within this bandwidth can be obtained by using a VCO of an oscillating frequency range of 3.610–3.760 GHz and dividing its output frequency by 2. Consequently, a switch SW should be opened to make the VCO output pass through one ½ DV. In another example, in an R-GSM compliant system, a receiving frequency bandwidth of 921 to 960 MHz is used. In this system, a local signal with a frequency falling within this bandwidth can be obtained by using a VCO of an oscillating frequency range of 3.684–3.840 GHz and dividing its output frequency by 4, and, therefore, the switch SW should be closed to make the VCO output pass through two ½ DVs. For P-GSM, GSM1900, and other systems, it will be appreciated that the system-dependent predetermined frequency can be obtained by appropriately selecting a VCO with an oscillating frequency range and the number of frequency dividers in the same way as described above.

Figure 15:
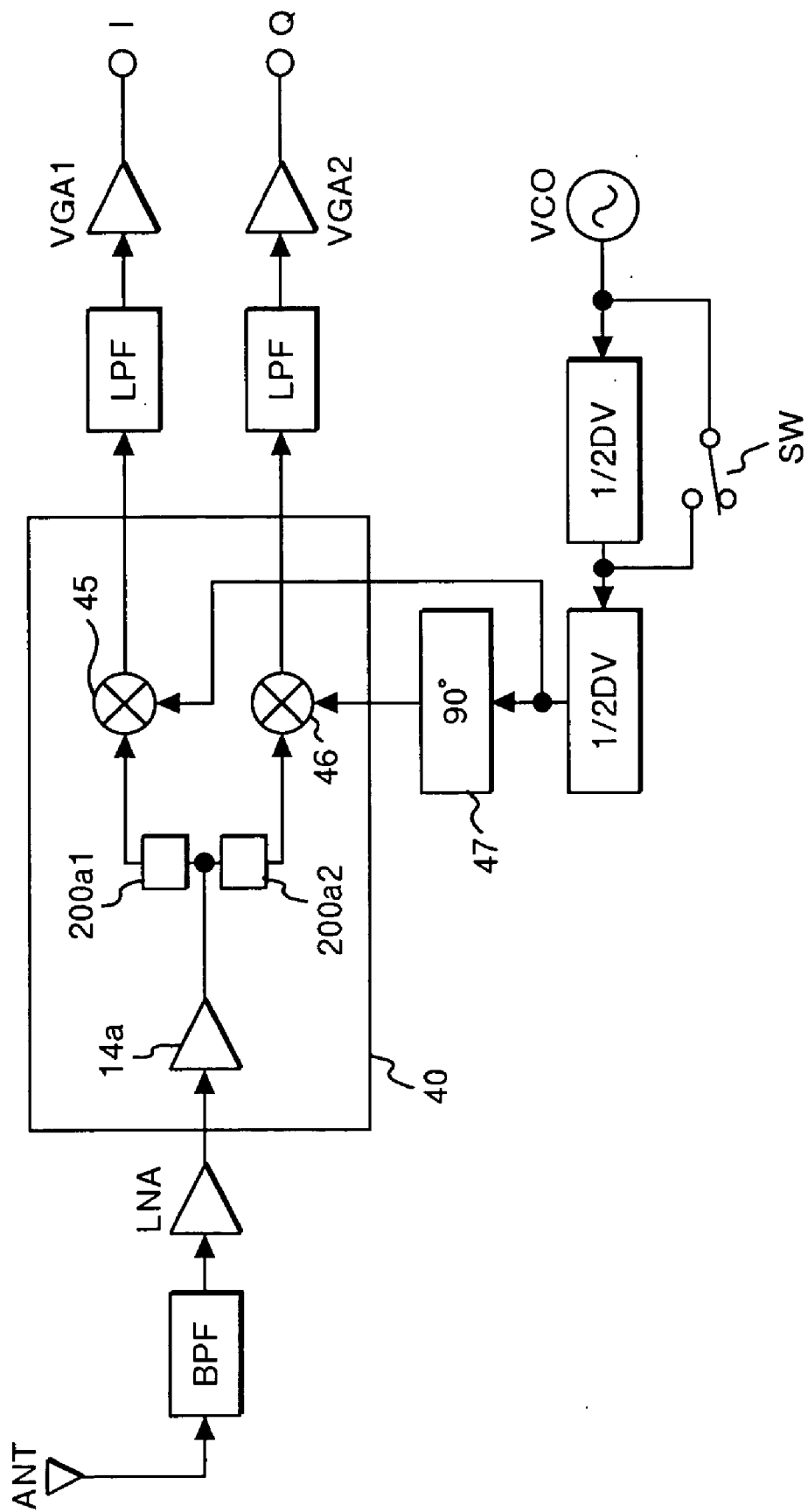
FIG. 15 is a structural diagram of the receiver of FIG. 14 to which the quadrature mixer of Embodiment 3 of the invention applied.

Assuming the application of the quadrature mixer configuration of Embodiment 3 shown in FIG. 9 to the quadrature mixer 40 of the direct conversion receiver which is configured as described above, only the single V/I converter 17a shown in FIG. 9 should be required, instead of the two V/I converters 43 and 44 required in the receiver configuration of FIG. 14. Accordingly, there is no need for dividing the output of the low noise amplifier LNA. Thus, decrease in the voltage of the output of the low noise amplifier LNA does not occur. Because of no drop in the output of the low noise amplifier LNA, the two buffers BF1 and BF2 required in the receiver configuration of FIG. 14 can be removed as unnecessary ones. The receiver configuration is modified to that shown in FIG. 15. If an 8 mA current flows through each of the mixer cores 40 and 41 and a 4 mA current flows through each buffer, a total of current consumption of 24 mA is required. In the quadrature mixer of the receiver configuration of FIG. 15 to which the quadrature mixer of Embodiment 3 applied, current consumption is considered to be only 8 mA, which is one third of the above current consumption, because this quadrature mixer dispenses with the buffers.

Figure 10:
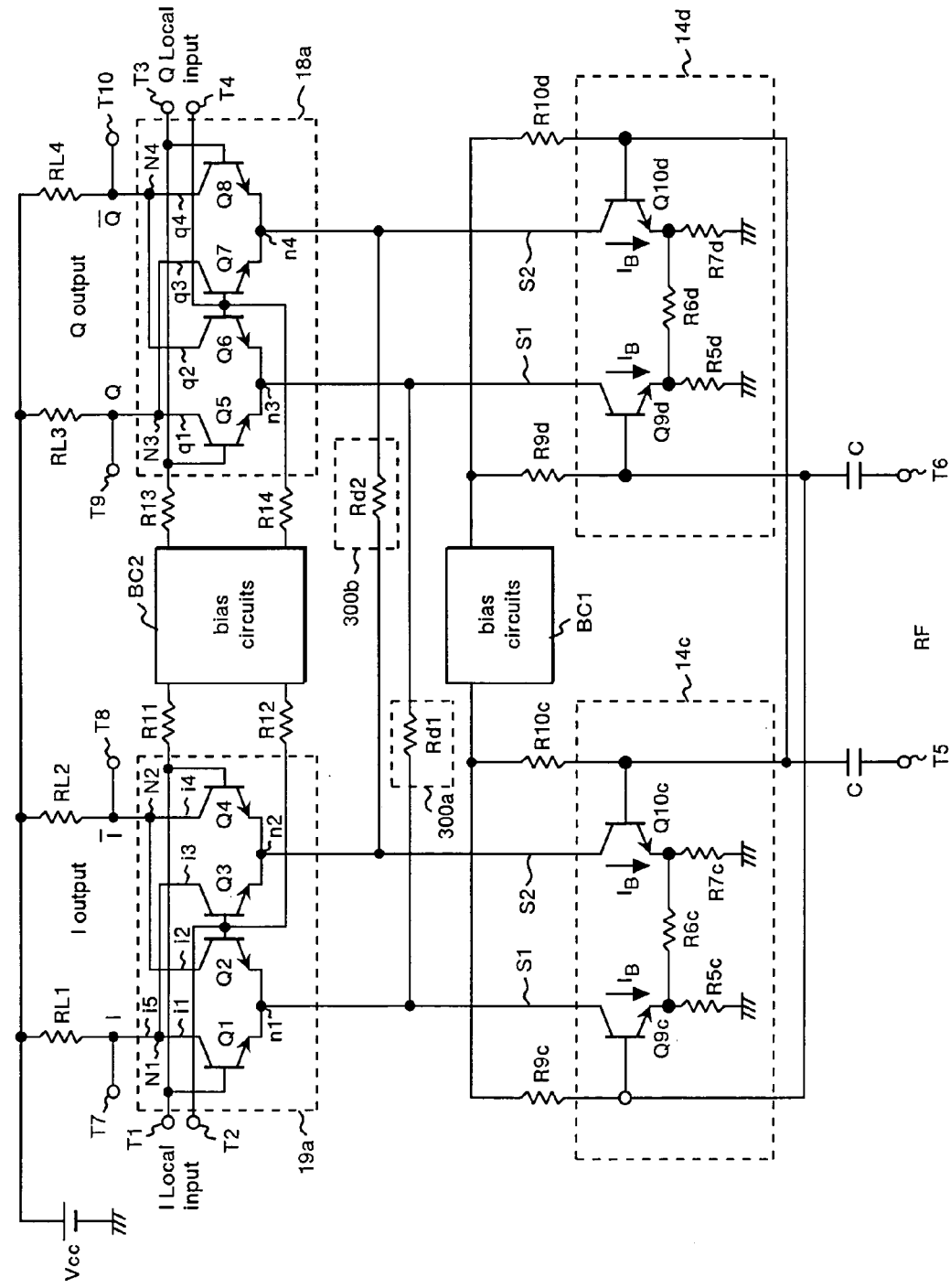
FIG. 10 is a diagram showing a quadrature mixer according to a preferred Embodiment 4 of the present invention.

FIG. 10 is a diagram showing a quadrature mixer according to a preferred Embodiment 4 of the present invention, which is a circuit schematic of a configuration example of the quadrature mixer including attenuators. In Embodiment 4, only the main part of the quadrature mixer is shown with the omission of the oscillator which generates local signals and the 90° phase shifter. In FIG. 10, for explanatory convenience, constituent elements corresponding to those shown in FIG. 9 are assigned the same reference numbers and their detailed explanation is not repeated. The quadrature mixer configuration of FIG. 10 differs from that of FIG. 9 in the following points: i.e., two V/I converters 14c and 14d of same structure, each operating on a bias IB that is a half of the IB required for the operation of the V/I converter 14a, are installed, instead of the V/I converter 14a, and an attenuator 300a consisting of a resistor Rd1 and an attenuator 300b consisting of a resistor Rd2 are installed, instead of the current dividers 200a1 and 200a2.

More specifically, the quadrature mixer circuit of FIG. 10 differs from that of FIG. 9 in the following points. An output signal s1 which emerges at the collector of a transistor Q9c of the V/I converter 14c is routed to the current input node n1 of the second differential pair and an output signal s1 which emerges at the collector of a transistor Q9d of the V/I converter 14d is routed to the current input node n3 of the second differential pair. The current input node n1 of the second differential pair and the current input node n3 of the fourth differential pair are connected via the attenuator 300a. An output signal s2 which emerges at the collector of a transistor Q10c of the V/I converter 14c is routed to the current input node n2 of the third differential pair and an output signal s2 which emerges at the collector of a transistor Q10d of the V/I converter 14d is routed to the current input node n4 of the fourth differential pair. The current input node n2 of the third differential pair and the current input node n4 of the fifth differential pair are connected via the attenuator 300b.

Figure 16:
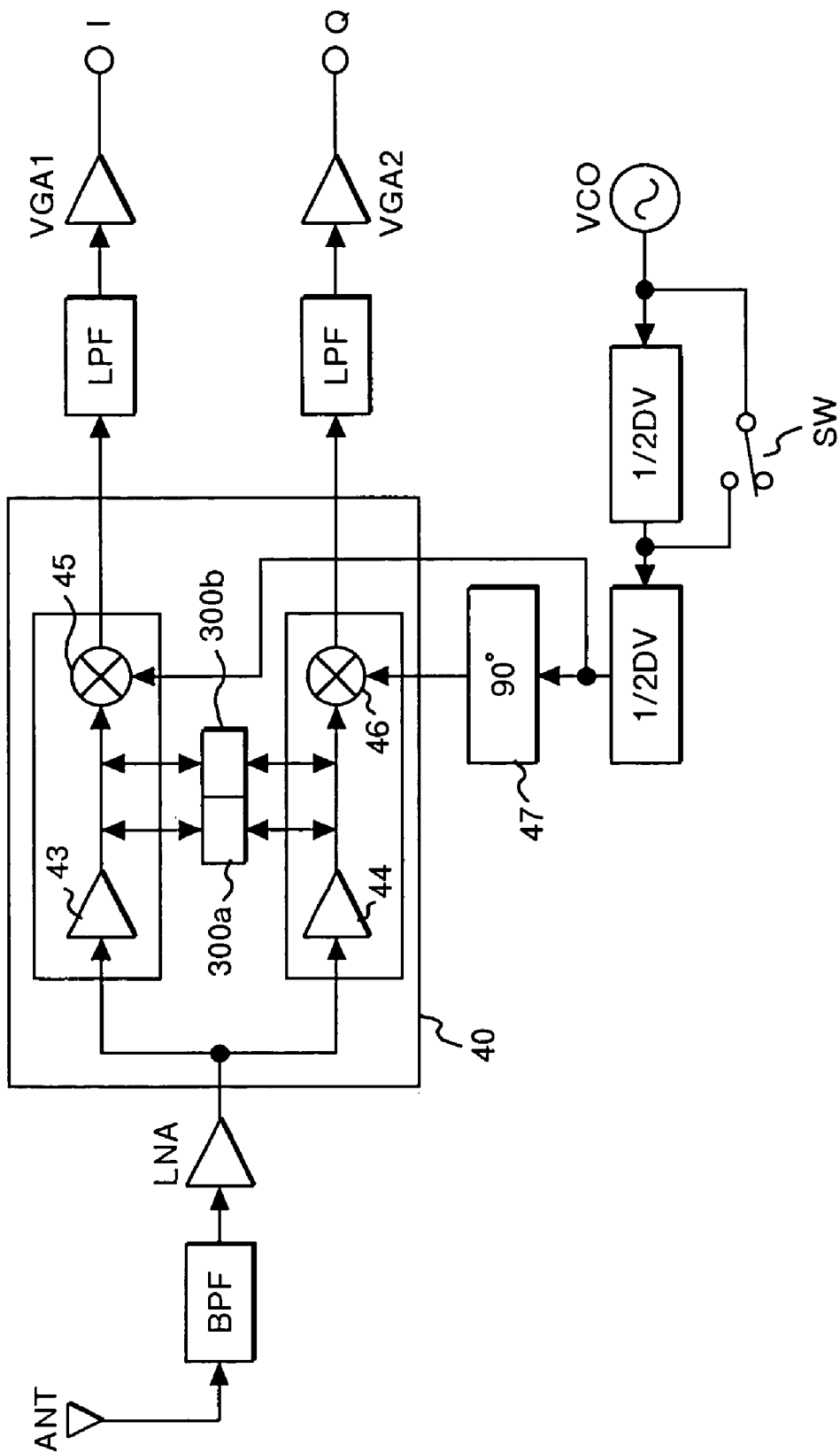
FIG. 16 is a structural diagram of the receiver of FIG. 14 to which the quadrature mixer of Embodiment 4 of the invention applied.

The quadrature mixer of Embodiment 4 which is configured as described above has a high impedance for less current it carries, because the V/I converters 14c and 14d operate with a half operating current IB. Assuming the application of the quadrature mixer of Embodiment 4 to the receiver circuitry of FIG. 14, the buffers BF1 and BF2 between the low noise amplifier LNA and the V/I converters can be removed as unnecessary ones and, consequently, the receiver configuration is modified to that shown in FIG. 16.

In Embodiment 4 also, as for the resistors Rd1 and Rd2 of the attenuators 300a and 300b, obviously, any of the resistors illustrated in FIGS. 11 to 13 maybe used to reduce leak signal components, that is, RF signal leaks from the local oscillator across the parasitic capacitance.

While several preferred embodiments of the invention has been described hereinbefore, it will be appreciated that various design changes may be made without departing from the spirit and scope of the present invention.

What is claimed is:

1. A quadrature mixer circuit comprising:
    an input terminal;
    a divider which divides a signal from said input terminal into substantially equal two parts, a first output signal and a second output signal;
    a first voltage-current converter to which a bias current is supplied from a first DC source and which converts the voltage of the first output signal from said divider into signal current;
    a second voltage-current converter to which a bias current is supplied from a second DC source and which converts the voltage of the second output signal from said divider into signal current;
    a local signal oscillator;
    a 90° phase shifter which outputs a local signal whose phase is substantially 90 degrees ahead or behind the phase of a local signal from said local signal oscillator;
    a first current switch circuit which switches on/off current output from said first voltage-current converter at timing of the local signal from said local signal oscillator;
    a first current-voltage converter which converts current output from said first current switch circuit into a voltage signal;
    a second current switch circuit which switches on/off current output from said second voltage-current converter at timing of the local signal output from said 90° phase shifter; and
    a second current-voltage converter which converts current output from said second current switch circuit into a voltage signal,
    wherein said quadrature mixer circuit includes an attenuator which attenuates signal current or voltage between a current output terminal of said first voltage-current converter and a current output terminal of said second voltage-current converter.

2. The quadrature mixer circuit as recited in claim 1, wherein:
the bias current to be supplied to said first voltage-current converter is equal to or more than a bias current to be supplied to said first current switch circuit, and
the bias current to be supplied to said second voltage-current converter is equal to or more than a bias current to be supplied to said second current switch circuit.

3. The quadrature mixer circuit as recited in claim 1, wherein:
said attenuator includes a resistor.

4. A mobile terminal characterized by using the quadrature mixer circuit as recited in claim 1.

5. A semiconductor integrated circuit for RF communication in which a Gilbert cell type quadrature mixer circuit is built, said quadrature mixer circuit comprising:
a first differential circuit which receives an RF received signal voltage or an IF received signal voltage converted from the RF received signal voltage and converts the signal voltage into first and second RF received signal currents with 180 degree phase difference or first and second IF received signal currents with 180 degree phase difference;
a sixth differential circuit which has structure identical to the structure of the first differential circuit, receives said RF received signal voltage or said IF received signal voltage, and converts the signal voltage into third and fourth RF received signal currents with 180 degree phase difference or third and fourth IF received signal currents with 180 degree phase difference;
a local signal oscillator;
a 90° phase shifter which outputs a local signal whose phase is 90 degrees ahead or behind the phase of a local signal from the local signal oscillator;
a second differential circuit which has a first current input terminal through which current is input, receives the local signal from said local signal oscillator, switches on/off the current input through said first current input terminal at timing of said local signal oscillator, and converts the input current into first and second I output signal currents with 180 degree phase difference;
a third differential circuit which has a second current input terminal through which current is input, receives the local signal from said local signal oscillator, switches on/off the current input through said second current input terminal at timing of 180 degree phase difference from said local signal oscillator, and converts the input current into third and fourth I output signal currents with 180 degree phase difference;
a fourth differential circuit which has a third current input terminal through which current is input, receives the local signal output from said 90° phase shifter, switches on/off the current input through said third current input terminal at timing of the local signal output from said 90° phase shifter, and converts the input current into first and second Q output signal currents with 180 degree phase difference;
a fifth differential circuit which has a fourth current input terminal through which current is input, receives the local signal output from said 90° phase shifter, switches on/off the current input through said fourth current input terminal at timing of 180 degree phase difference from said local signal output from said 90° phase shifter, and converts the input current into third and fourth Q output signal currents with 180 degree phase difference;

a first I signal current addition and coupling point at which said first I output signal current and said third I output signal current are added and coupled and a resultant fifth I signal current is output;
a second I signal current addition and coupling point at which said second I output signal current and said fourth I output signal current are added and coupled and a resultant sixth I signal current is output;
a first Q signal current addition and coupling point at which said first Q output signal current and said third Q output signal current are added and coupled and a resultant fifth Q signal current is output; and
a second Q signal current addition and coupling point at which said second Q output signal current and said fourth Q output signal current are added and coupled and a resultant sixth Q signal current is output;
wherein:
the first RF received signal current or first IF received signal current from said first differential circuit is routed to said first current input terminal;
the second RF received signal current or second IF received signal current from said first differential circuit is routed to said second current input terminal;
the third RF received signal current or third IF received signal current from said sixth differential circuit is routed to said third current input terminal;
the fourth RF received signal current or fourth IF received signal current from said sixth differential circuit is routed to said fourth current input terminal;
said first current input terminal is connected via a first voltage dropping element to said third current input terminal; and
said second current input terminal is connected via a second voltage dropping element having equal impedance to the impedance of said first voltage dropping element to said fourth current input terminal.

6. The semiconductor integrated circuit for RF communication as recited in claim 5, wherein:
the sum of the operating currents of said first and sixth differential circuits diminishes so as to be approximately equal to the operating current of a first differential circuit included in a semiconductor integrated circuit that comprises:
the first differential circuit which receives an RF received signal voltage or an IF received signal voltage converted from the RF received signal voltage and converts the signal voltage into first and second RF received signal currents with 180 degree phase difference or first and second IF received signal currents with 180 degree phase difference;
a local signal oscillator;
a 90° phase shifter which outputs a local signal whose phase is 90 degrees ahead or behind the phase of a local signal from the local signal oscillator;
a second differential circuit which has a first current input terminal through which current is input, receives the local signal from said local signal oscillator, switches on/off the current input through said first current input terminal at timing of said local signal oscillator, and converts the input current into first and second I output signal currents with 180 degree phase difference;
a third differential circuit which has a second current input terminal through which current is input, receives the local signal from said local signal oscillator, switches on/off the current input through said second current input terminal at timing of 180 degree phase difference from said local signal oscillator, and converts the input current into third and fourth I output signal currents with 180 degree phase difference;
a fourth differential circuit which has a third current input terminal through which current is input, receives the local signal output from said 90° phase shifter, switches on/off the current input through said third current input terminal at timing of the local signal output from said 90° phase shifter, and converts the input current into first and second Q output signal currents with 180 degree phase difference;
a fifth differential circuit which has a fourth current input terminal through which current is input, receives the local signal output from said 90° phase shifter, switches on/off the current input through said fourth current input terminal at timing of 180 degree phase difference from the local signal output from said 90° phase shifter, and converts the input current into third and fourth Q output signal currents with 180 degree phase difference;
a first I signal current addition and coupling point at which said first I output signal current and said third I output signal current are added and coupled and a resultant fifth I signal current is output;
a second I signal current addition and coupling point at which said second I output signal current and said fourth I output signal current are added and coupled and a resultant sixth I signal current is output;
a first Q signal current addition and coupling point at which said first Q output signal current and said third Q output signal current are added and coupled and a resultant fifth Q signal current is output; and
a second Q signal current addition and coupling point at which said second Q output signal current and said fourth Q output signal current are added and coupled and a resultant sixth Q signal current is output;

wherein:
the first RF received signal current or first IF received signal current from said first differential circuit is routed through a first voltage dropping element to said first current input terminal and routed through a second voltage dropping element having equal impedance to the impedance of the first voltage dropping element to said third current input terminal; and
the second RF received signal current or second IF received signal current from said first differential circuit is routed through a third voltage dropping element having equal impedance to the impedance of said first and second voltage dropping elements to said second current input terminal and routed through a fourth voltage dropping element having equal impedance to the impedance of said first, second, and third voltage dropping elements to said fourth current input terminal.

7. The semiconductor integrated circuit for RF communication as recited in claim 5, wherein:
said first and second voltage dropping elements are made, using the polycrystalline silicon layer formed on the insulating layer on the surface of the silicon substrate.

8. The semiconductor integrated circuit for RF communication as recited in claim 5, wherein:
said first and second voltage dropping elements are made, using the metal wiring layers formed on the insulating layer on the surface of the silicon substrate and shaped into the meandering pattern shape.

9. The semiconductor integrated circuit for RF communication as recited in claim 5, wherein:
said first and second voltage dropping elements are made, using the metal wiring layers formed on the insulating layer on the surface of the silicon substrate and shaped into the spiral shape pattern.

* * * * *